(12) United States Patent
Meyrath et al.

(10) Patent No.: US 11,282,822 B2
(45) Date of Patent: Mar. 22, 2022

(54) POWER ELECTRONIC CIRCUIT HAVING A PLURALITY OF POWER MODULES

(71) Applicant: Siemens Aktiengesellschaft, Munich (DE)

(72) Inventors: Wilhelm Meyrath, Vienna (AT); Franz Pfleger, Vienna (AT); Peter Prankh, Groß-Enzersdorf (AT); Jörg Strogies, Berlin (DE); Bernd Müller, Falkenberg (DE); Klaus Wilke, Berlin (DE); Matthias Heimann, Potsdam (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 16/967,655

(22) PCT Filed: Jan. 14, 2019

(86) PCT No.: PCT/EP2019/050781
§ 371 (c)(1),
(2) Date: Aug. 5, 2020

(87) PCT Pub. No.: WO2019/154592
PCT Pub. Date: Aug. 15, 2019

(65) Prior Publication Data
US 2021/0242187 A1   Aug. 5, 2021

(30) Foreign Application Priority Data
Feb. 6, 2018   (DE) .......................... 102018201842.1

(51) Int. Cl.
*H01L 25/16* (2006.01)
*H01L 25/18* (2006.01)
(Continued)

(52) U.S. Cl.
CPC .......... *H01L 25/112* (2013.01); *H01L 23/473* (2013.01); *H01L 23/49589* (2013.01)

(58) Field of Classification Search
CPC .................................................. H01L 25/112
See application file for complete search history.

(56) References Cited

U.S. PATENT DOCUMENTS 6,297,960 B1   10/2001   Moden et al. ................. 361/719
6,954,368 B1   10/2005   Francoeur et al. ........... 363/144
(Continued)

FOREIGN PATENT DOCUMENTS

CN   1507658 A   6/2004   ......... H01L 21/8242
CN   102844816 A   12/2012   ............. G11C 11/24
(Continued)

OTHER PUBLICATIONS

Search Report for International Application No. PCT/EP2019/052266, 11 pages, dated May 7, 2019.
(Continued)

*Primary Examiner* — Omar F Mojaddedi
(74) *Attorney, Agent, or Firm* — Slayden Grubert Beard PLLC

(57) ABSTRACT

Various embodiments of the teachings herein include power electronic circuits comprising: interconnected power modules, each with a power electronic element and a plurality of capacitors in parallel. The power electronic elements are mounted on a first side of substrate plates. The capacitors are mounted in a plurality of planes one above the other on a second side of the substrate plates. The substrate plates, with the power electronic elements forward and alongside each other, are fixed onto an assembly side of a base circuit carrier.

15 Claims, 4 Drawing Sheets

(51) Int. Cl.
*H01L 25/11* (2006.01)
*H01L 23/64* (2006.01)
*H01L 23/473* (2006.01)
*H01L 23/495* (2006.01)

(56) References Cited

U.S. PATENT DOCUMENTS

| | | | |
|---|---|---|---|
| 6,974,987 B2 | 12/2005 | Ogawa et al. | 257/296 |
| 7,521,788 B2 | 4/2009 | Bang et al. | 257/698 |
| 7,881,086 B2 | 2/2011 | Nakayama et al. | 363/144 |
| 8,188,786 B2 | 5/2012 | Hsu et al. | 327/594 |
| 8,988,857 B2 | 3/2015 | Mcconnell et al. | 361/308.1 |
| 9,042,079 B2 | 5/2015 | Masuda et al. | 361/306.3 |
| 9,260,946 B2 | 2/2016 | Sneisen | |
| 9,305,732 B2 | 4/2016 | Murowaki et al. | |
| 9,601,274 B2 | 3/2017 | Kojima et al. | |
| 2002/0088977 A1 | 7/2002 | Mori | H01L 27/108 |
| 2003/0031914 A1* | 2/2003 | Frank | H01M 8/0267 429/435 |
| 2007/0190409 A1* | 8/2007 | Sakurai | H01G 2/14 429/159 |
| 2009/0140400 A1* | 6/2009 | Arney, Jr. | H05K 1/162 257/664 |
| 2010/0134947 A1 | 6/2010 | Goudy, Jr. | 361/274.2 |
| 2011/0220979 A1 | 9/2011 | Kawashima et al. | 257/296 |
| 2012/0134069 A1 | 5/2012 | Dooley et al. | 361/330 |
| 2013/0107423 A1 | 5/2013 | Nieva Fatela et al. | 361/434 |
| 2013/0343027 A1 | 12/2013 | Perea et al. | 361/813 |
| 2014/0127535 A1 | 5/2014 | Schaefer et al. | 429/50 |
| 2015/0137238 A1 | 5/2015 | Tsunemi et al. | 257/347 |
| 2015/0173248 A1 | 6/2015 | Zeng | 361/709 |
| 2016/0174356 A1 | 6/2016 | Singh | H05K 1/02 |
| 2016/0181996 A1 | 6/2016 | Baecklund | 330/44 |
| 2017/0169955 A1 | 6/2017 | Miller | H01G 4/38 |
| 2017/0236643 A1 | 8/2017 | Peuser | H01G 4/228 |
| 2017/0345579 A1 | 11/2017 | Eidelman | H01G 9/042 |
| 2017/0367228 A1 | 12/2017 | Mcconnell et al. | |
| 2018/0206359 A1* | 7/2018 | McPherson | H02M 7/003 |

FOREIGN PATENT DOCUMENTS

| | | | |
|---|---|---|---|
| CN | 103632844 A | 3/2014 | H01G 4/248 |
| CN | 103999176 A | 8/2014 | H01G 4/12 |
| CN | 104021933 A | 9/2014 | H01G 2/06 |
| CN | 104064351 A | 9/2014 | H01G 2/00 |
| CN | 104081508 A | 10/2014 | H01L 21/02 |
| CN | 105006976 A | 10/2015 | H01G 4/005 |
| CN | 206 117 523 | 4/2017 | H02M 7/00 |
| DE | 91 07 692 | 8/1991 | H02M 1/00 |
| DE | 42 32 763 | 12/1995 | H02M 1/00 |
| DE | 697 15 214 | 4/2003 | H02M 7/00 |
| DE | 10 2014 101 024 | 12/2014 | H01G 1/02 |
| DE | 102014101024 B3 * | 12/2014 | H05K 7/1432 |
| EP | 0 914 708 | 9/2002 | H02M 7/00 |
| JP | 2005150764 A | 6/2005 | H01G 2/06 |
| WO | 2008 134251 | 11/2008 | H02B 1/30 |
| WO | 2016 058741 | 4/2016 | H01G 4/228 |

OTHER PUBLICATIONS

Search Report for International Application No. PCT/EP2019/050781, 24 pages, dated Mar. 14, 2019.
Searh Report for DE Application No. 10 2018 201 842.1, 10 pages, dated Sep. 26, 2018.
Chinese Office Action, Application No. 201980011594.7, 7 pages, dated May 27, 2021.
U.S. Non-Final Office Action, U.S. Appl. No. 16/967,610, 16 pages, dated Jul. 21, 2021.
Chinese Office Action, Application No. 201980011594.7, 7 pages.
U.S. Final Office Action, U.S. Appl. No. 16/967,610, 13 pages.

* cited by examiner

POWER ELECTRONIC CIRCUIT HAVING A PLURALITY OF POWER MODULES

CROSS-REFERENCE TO RELATED APPLICATIONS

This application is a U.S. National Stage Application of International Application No. PCT/EP2019/050781 filed Jan. 14, 2019, which designates the United States of America, and claims priority to DE Application No. 10 2018 201 842.1 filed Feb. 6, 2018, the contents of which are hereby incorporated by reference in their entirety.

TECHNICAL FIELD

The present disclosure relates to power electronic circuits having a plurality of interconnected power modules. The power modules each have at least one power electronic element.

BACKGROUND

Power electronic circuits must usually be adapted to a particular specified application case. These application cases differ individually, and therefore the design and manufacture of said power electronic circuits involves considerable expense. Said individual application cases represent an obstacle to automation in particular in the manufacture of power modules. In particular, the use of capacitors results in an increased assembly expense, since the required capacitances can only be achieved by the parallel wiring of multiple capacitors, and these must all be integrated into the power electronic circuit.

SUMMARY

The teachings of the present disclosure describe power electronic circuits that can be produced at reduced expense in terms of design and/or manufacture, particularly with regard to single-unit production of power modules or low unit volumes. For example, some power electronic circuit (42) having a plurality of interconnected power modules (11), wherein the power modules (11) each have at least one power electronic element (31), in particular a transistor, have a plurality of capacitors (15) which are wired in parallel and are electrically connected to the at least one power electronic element (31), characterized in that the power modules (11) are designed in such a way that the power electronic elements (31) are mounted on one side of substrate plates (12), the capacitors (15) are mounted in a plurality of planes one above the other on the other side of the substrate plates (12), wherein the substrate plates (12), with the power electronic elements (31) forward and alongside each other, are fixed onto an assembly side of a base circuit carrier (39).

In some embodiments, a circuit (42), by means of which the power electronic elements (31) of the power modules (11) are electrically contacted, is formed on the assembly side of the base circuit carrier (39).

In some embodiments, the power modules (11) are arranged in a row (43).

In some embodiments, the power modules (11) are arranged in a two-dimensional array in a plurality of adjacent rows (43).

In some embodiments, a carrier component (24, 62, 63, 65, 66, 67, 68) which is mechanically connected to at least some of the power modules (11) is provided for an additional function.

In some embodiments, the carrier component is fixed onto those sides of the power modules (11) which face away from the base circuit carrier (39).

In some embodiments, the carrier component consists of an intermediate circuit carrier (67) and, on a side of the intermediate circuit carrier which faces away from the power electronic elements (31), has a plurality of capacitors (15) which are wired in parallel and are electrically connected to the at least one power electronic element.

In some embodiments, at least one further carrier component for an additional function is fixed onto the capacitors (15) of the intermediate circuit carrier.

In some embodiments, the carrier component extends along adjacent power modules (11) and is fixed onto respective side faces formed thereby.

In some embodiments, the carrier component consists of a cooling device (60, 62).

In some embodiments, the carrier component consists of an additional circuit carrier (24, 63, 65, 68) with a circuit (27, 29).

In some embodiments, at least a driver circuit (49) for the power electronic circuit (42) and/or at least some of the power modules (11) are arranged on the additional circuit carrier (24, 63, 65, 68) as a circuit.

In some embodiments, the carrier component has at least one sensor element (25a, 25b, 25c), in particular a temperature sensor and/or a humidity sensor and/or a current sensor and/or an acceleration sensor, as an additional function.

In some embodiments, the carrier component has a mechanical stiffening structure, in particular ribs (30), as an additional function.

In some embodiments, each power module (11) has two power electronic elements (31) embodied as switching elements, the power electronic elements (31) of each power module (11) form a half bridge (48), the power electronic elements (31) are interconnected in three groups, such that each group is assigned to a phase of a three-phase alternating current, wherein each group can receive a direct current.

BRIEF DESCRIPTION OF THE DRAWINGS

Further details of the teachings herein are described below with reference to the drawings. Identical or corresponding elements in the drawing are denoted by the same reference signs in each case and are only explained more than once if there are differences between the individual figures. In the figures.

DETAILED DESCRIPTION

Figure 1:
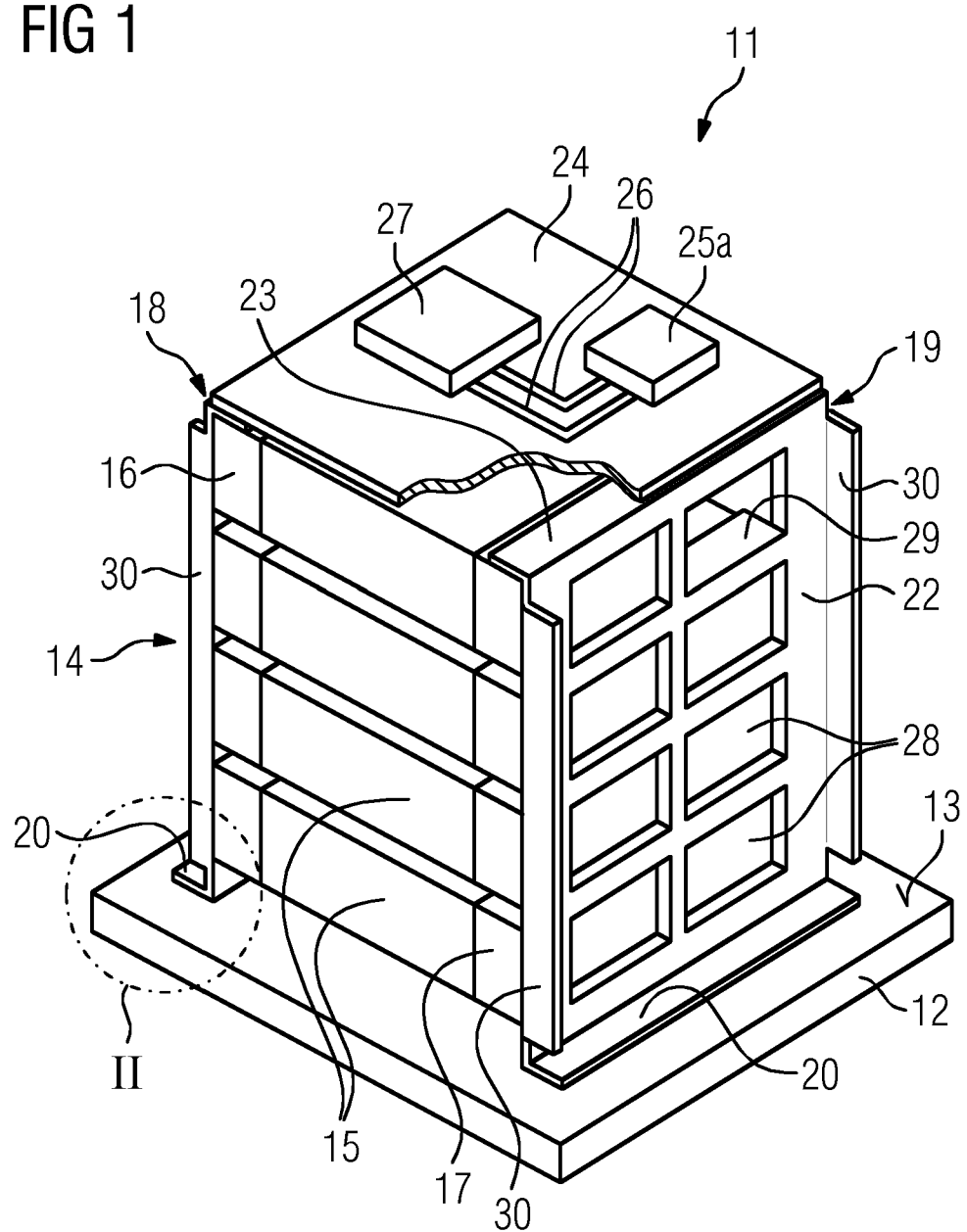
FIG. 1 shows a three-dimensional view, partially cut away, of a power module that can be installed in a power electronic circuit incorporating teachings of the present disclosure.

In some embodiments, the electronic circuit described herein, the power modules are so designed that the power electronic elements are mounted on one side of substrate plates. The capacitors are mounted in a plurality of planes one above the other on the other side of the substrate plates. In some embodiments, the substrate plates, with the power electronic elements forward and alongside each other, are fixed onto the assembly side of a base circuit carrier.

In some embodiments, the power electronic elements are bare chips. These can be contacted directly onto the substrate plate, e.g. by means of a sinter connection which also ensures an electrical contact. The substrate plate can be manufactured from a ceramic. This does not conduct the electrical current and therefore ensures electrical insulation at the same time. An electronic circuit can therefore be realized by structuring an electrically conductive coating on the substrate plate. In this way, e.g. contact areas for contacting the power electronic elements are provided.

The power modules can be combined with comparatively little expense to form various configurations during design and assembly on the base circuit carrier, in order to realize power electronic circuits for different requirements. The base circuit carrier can be designed as a printed circuit board, for example, wherein a circuit on the surface can be provided for contacting onto the power modules that are used. The base circuit carrier can however also consist of a housing part or similar, for example, wherein the housing is then used at the same time as a support body in the construction of the power electronic circuit.

By virtue of the capacitors being arranged in a plurality of planes one above the other on the other side of the substrate plates, it is possible to realize very short electrical connection paths between the capacitors and the power electronic elements. The capacitors can be wired in parallel in this case, so that comparatively high capacitances of the capacitor arrangements can be achieved using comparatively economical components. In this way, it is possible to keep the occurrence of parasitic inductances comparatively low.

In some embodiments, the arrangement of the capacitors in a plurality of planes can be achieved by stacking the capacitors, for example. Said capacitors have capacitor electrodes by means of which they can be held in a suitable holding device. A further possibility consists in mounting the capacitors on circuit carriers and stacking said circuit carriers one above the other, such that the capacitors mounted thereon lie in a plurality of planes one above the other. The circuit carriers are used as intermediate circuit carriers in this case (described in further detail below).

In some embodiments, the power modules are arranged in a row. This type of uniform arrangement has the advantage that the layout of such electronic circuits is simplified. Firstly, it is e.g. possible rapidly to calculate how an available structural volume can be optimally used. Furthermore, the uniform arrangement of the power modules also assists the uniform cooling thereof. Finally, the electrical connection paths between the individual modules can be shortened.

In some embodiments, the power modules to be arranged in a two-dimensional array in a plurality of adjacent rows. The advantages of an arrangement in rows as cited above apply analogously to this arrangement. This means firstly that short connection paths can be realized between the individual modules. Furthermore, the regular arrangement of the power modules in an array assists the optimal utilization of space within an available structural volume.

In some embodiments, a carrier component for an additional function is provided, said carrier component being mechanically connected to at least some of the power modules. Within the meaning of the disclosure, a carrier component is therefore understood to be a component which carries an element that is responsible for an additional function or which itself realizes this additional function. A mechanical connection of this carrier component to some or all of the power modules has the effect that an assignment of the additional function to specific or all power modules is possible. This assignment can be effected by means of electrical contacting, for example. In this case, the carrier component itself is likewise embodied as an additional circuit carrier. Within the meaning of the invention, "some of the power modules" can also signify "one power module" or "a plurality of (i.e. at least two) power modules".

In some embodiments, the carrier component is fixed onto those sides of the power modules which face away from the base circuit carrier. In other words, the carrier component is situated opposite the base circuit carrier. This means that the power modules are situated between the base circuit carrier and the carrier component. The side by means of which the power modules are mounted on the base circuit carrier is therefore opposite the side on which, according to this embodiment, the carrier component is placed.

In this geometric configuration, the carrier component can offer a comparatively large surface area on which the additional function can be provided. In particular the additional function can consist of additional electronic elements, the carrier component being embodied as a circuit carrier in this case. The carrier component can have the same dimensions, particularly in the connection plane between power modules and carrier component, as the base circuit carrier in the connection plane between power modules and base circuit carrier. The surface area which is then available for additional functionalities is therefore comparatively large.

The last-described carrier component can also consist of an intermediate circuit carrier. This is defined in that a plurality of capacitors, these being wired in parallel and being electrically connected to the at least one power electronic element, are mounted on a side of the intermediate circuit carrier which faces away from the power electronic elements. In other words, it is possible by means of the intermediate circuit carrier for the capacitors which are required for a specific power electronic element to be mounted and electrically contacted not only on the substrate plate but also on an intermediate circuit carrier situated above this. This allows the creation of a mechanically stable component framework and electrically reliable contacting. The intermediate circuit carriers can moreover be used to accommodate additional functionalities, wherein electrical contacting of these additional functionalities is possible in particular.

Obviously, it is possible to fix at least one further carrier component for an additional function onto the capacitors of the intermediate circuit carrier. This further carrier component can itself be a further intermediate circuit carrier, on which further capacitors are mounted on that side of this intermediate circuit carrier which faces away from the power electronic elements. These further capacitors are then, as described above, wired in parallel and electrically connected to the at least one power electronic element. The accommodation of additional capacitors is therefore also understood as an additional function within the meaning of the disclosure. It is of course also possible to provide other additional functions on the further carrier component (in addition or alternatively to the capacitors). Further additional functions could be, for example, a driver circuit for the power electronic element situated below.

In some embodiments, it is alternatively possible for the carrier component to extend along adjacent power modules and be fixed onto respective side faces formed thereby. Within the meaning of the disclosure, side faces are those surface areas which extend laterally in relation to a power module that is mounted on the base circuit carrier. The base circuit carrier therefore represents the reference surface area and the side faces effectively extend away therefrom, preferably at an angle of 90°, if the power module has an essentially cuboid shape.

In some embodiments, adjacent power modules which are situated alongside each other in a row can be connected together by means of the last-cited carrier component. This produces a mechanical stabilization. Moreover, the assembly expense may be significantly reduced in comparison with the use of individual carrier components for each individual module. Functionalities such as e.g. cooling can be realized thereby at comparatively low assembly expense. Particularly in the case of active coolers through which a cooling medium flows, in particular a cooling liquid such as cooling water, the assembly expense decreases considerably since fewer interfaces overall must be connected for the coolant. This also improves the reliability in relation to possible leaks of the cooler.

As mentioned above, the carrier component can also carry a circuit as an additional function. In some embodiments, the carrier component is embodied as an additional circuit carrier. The circuit can perform various tasks. For example, the circuit can be a driver circuit for the power electronic circuit and/or at least some of the power modules. The driver circuit for the power electronic circuit of the respective power module controls the at least one power electronic element, so that this can perform its intended functionality. A driver circuit for at least some of the power modules of the power electronic circuit, e.g. all of the power modules of the power electronic circuit, can be used in order to implement an operating regime for the power electronic circuit. In this operating regime, power modules can be switched in or out as a function of the operating state in order to ensure full-load operation or part-load operation, for example. In this way, it is possible during part-load operation to save energy and therefore to improve the efficiency of the power electronic circuit.

In some embodiments, the carrier component has at least one sensor element as an additional function. In particular, this can be a temperature sensor and/or a humidity sensor and/or a current sensor and/or an acceleration sensor. Temperature sensors may be deployed in order to allow the operating temperature of the power modules to be monitored, for example. This allows a power module to be switched out in a timely manner, for example, in order to prevent overload or damage. A temperature sensor can however also be deployed in order to determine the ambient temperature of the power electronic circuit and to determine the anticipated cooling effect, for example. Humidity sensors can be used to monitor the operating conditions for the power electronic circuit. If the humidity is excessive, the power electronic circuit must be dried before operation or further operation is possible. Excessive humidity can occur due to the formation of condensation in the case of low external temperatures, for example. A further possible cause is the occurrence of a leak in a water cooling system.

Current sensors are deployed in order to monitor the operating state of the power electronic circuit. For example, the current loads in the individual power modules can be compared with each other. A current measurement may also be required, for example, in order to operate a driver circuit for the power modules (described in further detail below).

In some embodiments, the sensor element can be an acceleration sensor. Acceleration sensors allow the identification of mechanical stresses on the power electronic circuit. For example, it is possible to register events which prevent continued operation of the power electronic circuit until maintenance is carried out, e.g. because the power electronic circuit has fallen over during mobile deployment. However, acceleration sensors can also be used to identify vibrations, for example. Depending on the frequency and severity of the vibration, e.g. flexible maintenance intervals can be specified for the power electronic circuit.

In some embodiments, the carrier component includes a mechanical stiffening structure, in particular ribs, as an additional function. Ribs are suitable for achieving a higher mechanical loading capacity of the power electronic circuit by simple means. As described above, in some variants the carrier component connects a plurality of power modules together, wherein the mechanical stiffening structure reduces relative movements of the power modules and therefore contributes to a stiffening of the power electronic circuit. This stiffening effect can be achieved at comparatively low manufacturing and assembly expense.

In some embodiments, each power module has two power electronic elements embodied as switching elements. Such power modules can be contacted in such a way that the power electronic elements of each power module form a half bridge. In this case, one electrode from each of the two power electronic elements is joined together. The half bridge may be so embodied as to have a contacting means for an external interface. In addition, the power electronic elements of the preferred power electronic circuit are interconnected in three groups. Said interconnection is designed in such a way that each group is assigned to a phase of a three-phase alternating current, wherein each group can receive a direct current. The respective phase of the three-phase alternating current is picked up via the half bridges of the respective group of power electronic elements. The direct current is introduced in each case via the free electrodes of the respective power electronic elements (described in further detail below).

In some embodiments, the described components of the embodiment variants represent in each case individual features of the teachings herein which must be examined independently of each other, wherein said features also develop the invention independently of each other in each case and must therefore be considered, both individually or in a combination other than that shown, as a constituent part of the teachings herein. Furthermore, the embodiment variants described can also be supplemented by further features of the disclosure as described above.

A power module 11 as per FIG. 1 has a substrate plate 12, on whose visible top side 13 a capacitor structure 14 has been mounted in accordance with a surface assembly method. The capacitor structure has eight capacitors 15, of which only seven are illustrated in FIG. 1 (the right-hand upper capacitor is omitted; further details below). The capacitors 15 each have first capacitor electrodes 16 and second capacitor electrodes 17, wherein the first capacitor electrodes 16 are electrically contacted onto a first electrode 18 and the second capacitor electrodes 17 onto a second electrode 19 by means of soldered connections (not shown in detail) or another material or positive connection. Furthermore, the first electrode 18 and the second electrode 19 each have a contact structure 20 which, on its bottom side, forms a first interface surface on the first electrode and a second interface surface on the second electrode (not visible in FIG. 1 since the top side 13 is shown). By means of the first interface surface and the second interface surface, which together form the assembly side of the capacitor structure 14, the latter is mounted onto the top side of the substrate plate 12 using a soldered connection (not shown in detail) or other electrical connection 21 (cf. FIG. 2).

The first electrode 18 and the second electrode 19 together form a retaining structure for the capacitors 15. Since the capacitors 15 are connected via their first contact electrodes 16 and their second contact electrodes 17 to side walls 22 of the first electrode 18 and second electrode 19, a self-supporting capacitor structure 14 is produced even though the first electrode 18 and the second electrode 19 are not connected directly together. The capacitor structure 11 gains additional stability as a result of assembly on the substrate plate 12. Moreover, a circuit carrier 24 is fixed onto receiving structures 23 of the first electrode 18 and the second electrode 19 as an additional structural component, wherein the circuit carrier 24 creates a connection between the first electrode 18 and the second electrode 19 and thus stabilizes the retaining structure.

Windows 28 are punched into the side wall 22 of the first electrode 18 (not visible in FIG. 1) and the second electrode 19. This makes it possible for tabs 29 to be bent into the interior of the retaining structure, thereby assisting the positioning of the capacitors 15 and also enlarging the electrical contact area. Since the capacitor situated at the top on the right-hand side has been omitted behind the side wall 22, the tab 29 can be shown there. In the other windows, the tabs are concealed by the second capacitor electrodes 17.

A sensor element 25a is fixed onto the circuit carrier 24, wherein said sensor element 25a can be a temperature sensor, a humidity sensor, a gas sensor or an acceleration sensor, for example. The sensor element 25a is connected via conductor tracks 26 on the circuit carrier 24 to an evaluation circuit, e.g. in the form of an integrated circuit. The integrated circuit 27 can evaluate the sensor signal and make it available for further processing in a manner which is not shown in detail (e.g. via line connections which are not shown in detail or a wireless interface, i.e. via radio or infrared).

In some embodiments, the circuit carrier 24 is understood to be an additional circuit carrier. The additional function in the exemplary embodiment according to FIG. 1 consists in carrying functional components (integrated circuit 24, sensor element 25a). The circuit carrier 24 can, as illustrated in FIG. 1, be the same size as the power module 11. In this case, each power module can be equipped with a separate circuit carrier 24. It is however also possible to manufacture the circuit carrier 24 with a larger surface area, such that it spans a plurality of power modules (not shown in FIG. 1 but see FIGS. 6 and 7).

As a further structural component, ribs 30 are created as a stiffening structure on the side edges of the side wall 22. These can be produced by bending over the side edges of the side walls 22. The first electrode 18 and the second electrode 19 can therefore be economically produced as a punched grid (leadframe) by punching and subsequent bending. The receiving structures 23 and the contact structures 20 can also be produced by bending in each case.

Figure 2:
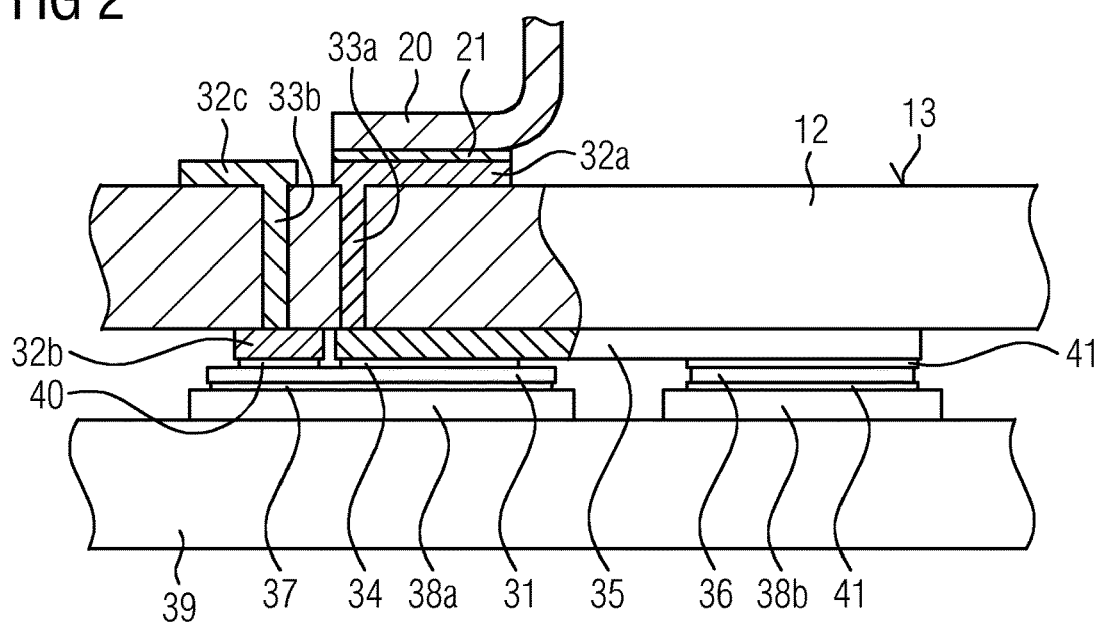
FIG. 2 shows the detail II according to FIG. 1, partially cut away.

FIG. 2 illustrates how contacting of the capacitor arrangement 14 according to FIG. 1 onto a power electronic element 31 in the form of a transistor can be achieved. For this purpose, the contact structure 20 is contacted onto a contact pad 32a via the soldered connection 21, the contact pad 32a being contacted onto a source electrode 34 of the power electronic element 31 via a through contact 33a. The source electrode 34 is also connected via a conductor track 35 to a spacer 36 having the same height as the power electronic element 31.

A drain electrode 37 of the power electronic element 31 is connected via a contact area 38a, and the spacer 36 via a contact area 38b, to a base circuit carrier 39. The base circuit carrier 39 provides a chassis on which is mounted the entire electronic circuit consisting of a plurality of power modules according to FIG. 1 (cf. also FIG. 3).

The power electronic element according to FIG. 2 is a transistor. In order to allow said transistor to be switched, a gate electrode 40 is also required. In order to allow said gate electrode 40 to be controlled, a through contact 33b is provided in the substrate plate 12, leading from a contact pad 32b to a contact pad 32c. Source electrode 34, gate electrode 40, drain electrode 37 and joining layers 41 at the spacer 36 are designed as sinter connections, for example.

Figure 3:
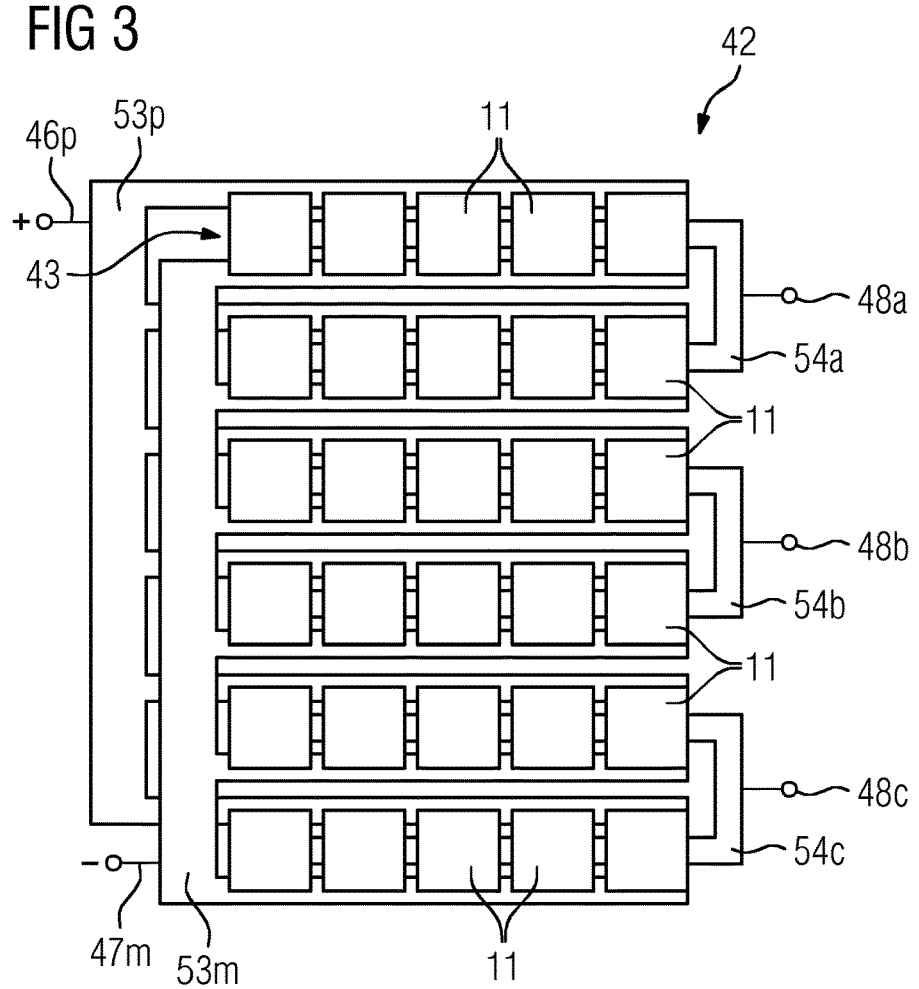
FIG. 3 shows a schematic top view of an exemplary embodiment of a power electronic circuit comprising a plurality of power modules which can be constructed as per FIG. 1 or in a similar manner, incorporating teachings of the present disclosure.
Figure 6:
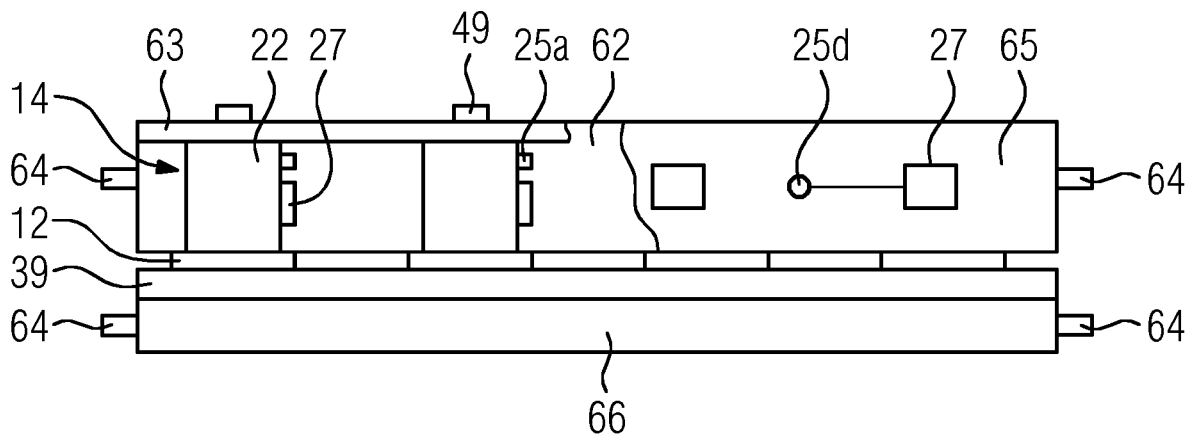
FIG. 6 shows a side view, partially cut away, of an exemplary embodiment of a power module incorporating teachings of the present disclosure with laterally attached carrier components.

FIG. 3 shows how a plurality of power modules 11 can be combined on a base circuit carrier 39 as per FIG. 2 to form a power electronic circuit 42. Five power modules 11 are configured in a row 43 in each case, a total of six rows being provided. It can be seen from FIG. 2 that only the left-hand side of the substrate plate 12 is illustrated, wherein the right-hand side has a further power electronic element 31 (as illustrated in FIG. 6). This means that a transistor is likewise installed as a power electronic element on that side of the substrate plate as per FIG. 2 which is not shown. This produces a contacting possibility which is realized for each power module 11 in FIG. 3 and is schematically illustrated as a circuit diagram in FIG. 4.

Figure 4:
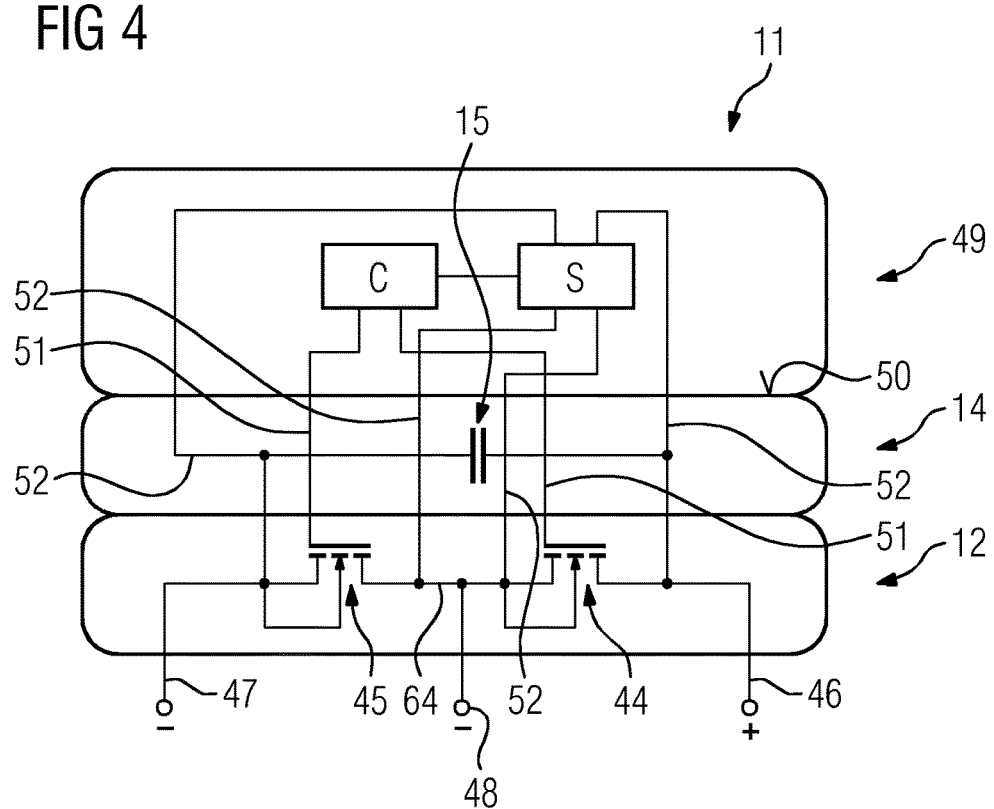
FIG. 4 schematically shows a circuit diagram for the contacting of power modules as per FIG. 1 in a power electronic circuit according to FIG. 3, incorporating teachings of the present disclosure.

FIG. 4 shows the capacitor 15 as a substitute for the entire capacitor structure as per FIG. 1. This is intended to simplify the illustration, wherein a plurality of capacitors wired in parallel can also be deployed as an alternative. The capacitor 15 according to FIG. 4, like the capacitor structure 14, is illustrated merely schematically. The same applies to the substrate plate 12 and the power electronic elements mounted thereon, these taking the form of a first transistor 44 and a second transistor 45. The first transistor 44 is attached with its source electrode to the positive (highside) terminal 46, while the second transistor 45 is attached at its drain electrode to the negative (lowside) terminal 47. The drain electrode of the first transistor 44 and the source electrode of the second transistor 45 are connected together, whereby a half bridge 64 with a phase contact 48 is produced.

Figure 5:
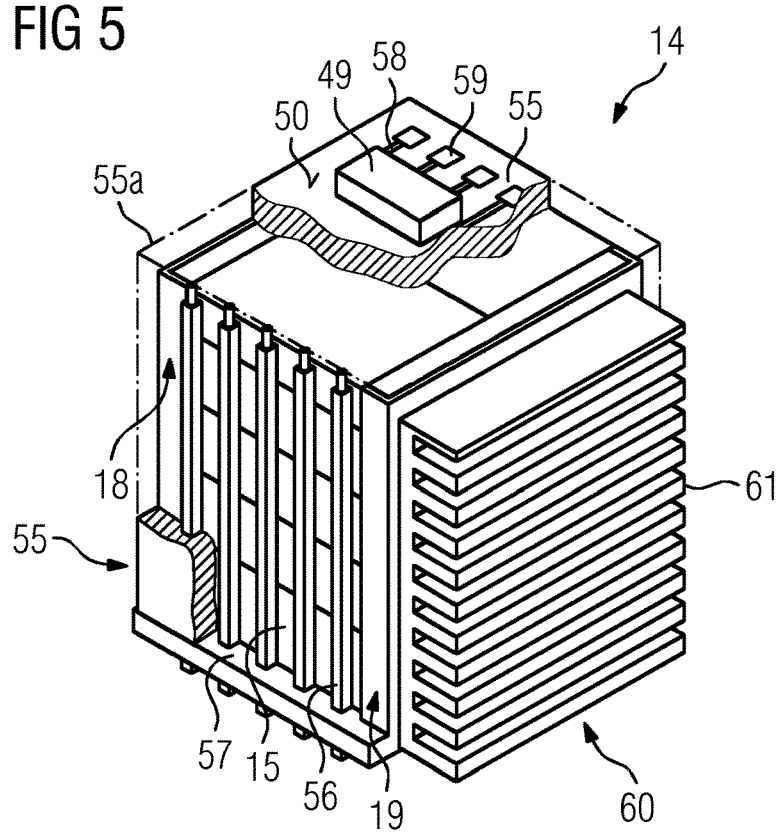
FIG. 5 shows a three-dimensional illustration, partially cut away, of a further embodiment of a capacitor structure incorporating teachings of the present disclosure that can be deployed in a power module according to FIG. 1.

For the purpose of controlling the power module 11, the capacitor structure 14 is equipped with a driver circuit 49, which can be placed on a top side 50 of the capacitor structure 14 according to FIG. 5, for example.

The driver circuit according to FIG. 4 is illustrated only schematically in order to describe its function in principle. The driver circuit has a controller function C and a sensor function S. The controller function is supported by contact lines 51 as an interface to the gate electrodes of the first transistor 44 and the second transistor 45. The driver circuit can therefore control both transistors as switches. The information required for this function is provided by the sensor function S. The sensor function is supported via signal lines 52 by means of which a current flow can be picked up in front of and behind the capacitor 15 and in front of and behind the phase contact 48 in the half bridge 64.

The capacitor 15 is connected to the positive terminal 46 and the negative terminal 47 and therefore performs a smoothing function, which is required for a multi-phase operation of the power electronic circuit 42 as per FIG. 3.

As shown in FIG. 3, the power electronic circuit 42 is constructed in a modular manner as per FIG. 3. By means of the circuit realized according to FIG. 4 by the power modules 11, these can be used together in three groups in each case in order to generate a three-phase alternating voltage from a direct voltage that is present at the shared positive terminal 46*p* and the shared negative terminal 47*m*, wherein said alternating voltage can be picked up at the shared phase contacts 48*a*, 48*b*, 48*c*. The strength of the maximum current that is to be switched determines how many of the power modules 11 must be deployed per phase. According to FIG. 3, there are ten power modules 11 per phase in each case.

It can be seen that the electrodes 53*m*, 53*p* of the positive terminal 46*p* and the negative terminal 47*m* are designed in the form of a comb, such that each first transistor 44 of each power module 11 can be contacted by means of the electrode 53*p* forming the positive terminal 46*p*, and each second transistor 45 of each power module 11 can be contacted by means of the electrode 53*m* forming the negative terminal 53*m*. The phase contacts 48*a*, 48*b*, 48*c* are each connected to U-shaped electrodes 54*a*, 54*b*, 54*c*, each of which contacts both the first capacitor 44 and the second capacitor 45 in the central region of the power modules 11 and thus contacts one of the three groups of ten power modules 11 via a half bridge (64 in FIG. 4). A circuit according to FIG. 4 is therefore realized for each of the power modules 11, each group of power modules 11 being wired in parallel.

In the capacitor arrangement 14 according to FIG. 5, a first electrode 18 and the second electrode 19 are used to contact the capacitors 15 in the manner described in relation to FIG. 1. According to FIG. 5, five capacitors 15 are arranged one above the other with two capacitors alongside each other in each case. The capacitor structure 14 has an electrically insulating material 55, thereby differing from FIG. 1. The material 55 according to FIG. 5 consists of synthetic material, wherein the first electrode 18 and the second electrode 19 are injection molded into the material 55 in such a way that contacting with the capacitors 15 is possible (so-called assembly injection molding).

The material 55 is only shown sectionally in FIG. 5. The housing structure formed by the material 55 is largely omitted, only the contours 55*a* formed by the material 55 being indicated by dash-dot lines. The structures indicated in the interior of the material are therefore visible in FIG. 5. In addition to the first electrode 18 and the second electrode 19 and the capacitors 15, these also include electrical conductive paths 56 which are formed by metallic conductors and electrically connect the top side 50 to the assembly side of the capacitor arrangement 14. The conductive paths on the assembly side form contact structures 57 which can be contacted onto a substrate plate (cf. 12 in FIG. 1) if corresponding contact pads are available there.

The driver circuit 49 according to FIG. 4 can be arranged on the top side 50. In order to allow said driver circuit 49 to control the power electronic elements 31 arranged on the substrate plate according to FIG. 2, use can be made of the conductive paths 56. For this purpose, conductor tracks 58 and contact pads 59 are provided on the top side 15, the contact pads 59 being electrically connected to the conductive paths 56.

The side wall formed by the electrode 19 is additionally used for the placement of a cooling device 60 as a structural component, said cooling device 60 consisting of a passive aluminum cooler with ribs 61. Alternatively (not shown), use could also be made of an active cooler with a cooling channel having an inlet and an outlet for a preferably liquid cooling medium.

Within the meaning of the present disclosure, the housing structure formed by the material 55 is understood to be a carrier component. For example, this carries the driver circuit 49 as a function. The cooling device 60 is also understood to be a carrier component within the meaning of the invention. Said cooling device 60 can be fixed directly to the electrode 19 to ensure a largely direct thermal conduction. In some embodiments, the material 55 of the housing structure can also be present in the region of the electrode 19 in order to ensure insulation. In this case, the cooling device 60 as a carrier component is fixed onto the carrier component that is formed by the material 55. Moreover, the cooling device 60 as illustrated in FIG. 5 is only fixed onto the capacitor structure 14 depicted in FIG. 5. It is however possible for the cooling device 60 to be larger in the direction of the ribs, such that adjacent capacitor structures (not shown) can also be contacted onto the cooling device (cf. also FIG. 6).

Illustrated in FIG. 6 is a base circuit carrier 39 on which a plurality of power modules are provided, each consisting of the substrate plates 12 and the capacitor structures 14 (not shown in detail in FIG. 6). It can be seen in FIG. 6 that the power modules are arranged in a row parallel to the plane of projection. Further power modules could be situated behind the power modules illustrated, forming adjacent rows which lie behind the plane of projection. To this extent, the structure according to FIG. 6 can also be embodied as a matrix arrangement similar to that in FIG. 3.

Figure 7:
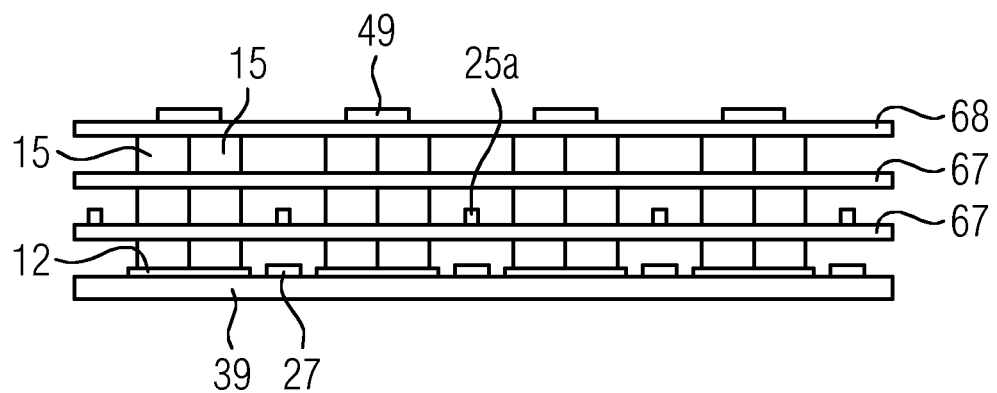
FIG. 7 shows a side view of an exemplary embodiment of a power electronic circuit with intermediate circuit carriers as carrier components incorporating teachings of the present disclosure.

The same also applies analogously to FIG. 7. Here the power modules are likewise arranged on the base circuit carrier 39 and lie in a row parallel to the plane of projection. Further power modules, which are not visible in FIG. 7, could be situated behind these power modules, a matrix structure similar to that in FIG. 3 being produced thereby.

In FIG. 6, an additional circuit carrier 63 on which the driver circuits 49 are mounted is deployed as a carrier component. The additional circuit carrier 63 therefore has conductor tracks (not shown in greater detail) which allow electrical contacting of the driver circuits 49 onto the power elements (not shown in FIG. 6). This can be effected using conductive paths 56 as illustrated in FIG. 5, for example. The additional circuit carrier 63 extends over the illustrated row of capacitor structures 14 in this case, and can also extend over capacitor structures which are situated behind said row if these are arranged as a matrix as per FIG. 3 (not shown in greater detail). It is particularly advantageous that the extension of the additional circuit carrier 63 in the direction of the plane of projection and perpendicularly thereto can correspond precisely to the dimensions of the base circuit carrier 39.

Further carrier components can be mounted on the side walls 22 of the capacitor structures 14. The carrier component also consists of an additional circuit carrier 65 on which e.g. vibration sensors 25*d* can be mounted, with integrated circuits 27 for control purposes. The additional circuit carrier 65 is in each case fixed onto a side wall 22 of all capacitor structures 14 belonging to the power modules illustrated in FIG. 6. Said side walls face towards the observer and can be seen behind the additional circuit carrier 65 by virtue of the partially cutaway illustration.

On that side of the power modules which faces away from the observer is arranged a cooling device 65 in the form of a liquid cooler. This has interfaces 64 via which a cooling liquid can be supplied and removed. The cooling device 65 likewise extends over the whole row of power modules illustrated in FIG. 6, and therefore these can be cooled together.

In some embodiments, a further cooling device 66 can be provided in a manner known per se on the opposite side of the base circuit carrier 69 to the power modules. This is likewise embodied as a liquid cooler and therefore has interfaces 64. Alternatively (not shown), a passive rib cooler or similar can also be used.

FIG. 7 illustrates a structure in which, in addition to the base circuit carrier 39, two intermediate circuit carriers 67 are deployed and therefore assume the function of additional circuit carriers. An additional circuit carrier 68 is provided on the capacitors as a further carrier component on top, the driver circuits 49 being mounted thereon as described in relation to FIG. 6. This further carrier component completes the entire component group at the top.

The intermediate circuit carriers 67 are used in a first alternative for the assembly of the capacitors 15. By virtue of the base circuit carrier 39 carrying the substrate plates 12 and these in turn each carrying two capacitors 15, and two capacitors 15 likewise being mounted on each of the two intermediate circuit carriers 67, the capacitors of the substrate plates 12 and of the intermediate circuit carriers 67 form for each power module in each case six capacitors which are arranged one above the other and alongside each other and together produce the capacitor structures in each case. The capacitors 15 on different planes are separated from each other by one of the intermediate circuit carriers 67 in each case, wherein an electrical parallel wiring of the capacitors can also be effected via the intermediate circuit carriers 67. The base plate 39, the intermediate circuit carriers 67 and the additional carrier component, which can preferably be designed as an additional circuit carrier 68 (cf. that cited as the additional circuit carrier 63 in FIG. 6), can each have identical surface areas and therefore be so arranged as to be aligned one above the other.

In some embodiments, as per FIG. 6, it is also possible for the intermediate circuit carriers 67 to have openings into which the capacitor structures fit precisely. The capacitor structures are embodied as per FIG. 1, for example, and therefore result in standalone structural units which are assembled on the base circuit carrier 39. The intermediate circuit carriers 67 with their openings can then be pushed over the capacitor structures, thereby producing the same side view as per FIG. 7, which is provided by the first alternative. The intermediate circuit carriers can be punched, for example, in order to create the openings through which the capacitor structures are pushed.

What is claimed is:

1. A power electronic circuit comprising:
    a plurality of interconnected power modules, wherein each power module includes a respective power electronic element and a respective plurality of capacitors wired in parallel and electrically connected to the respective power electronic element;
    wherein each of the power electronic elements is mounted on a first side of a respective substrate plate;
    wherein each respective plurality of capacitors is mounted in a plurality of planes one above the other on a second side of the substrate plates;
    wherein all of the substrate plates are fixed onto an assembly side of a base circuit carrier with the respective power electronic elements facing forward and alongside one another.

2. The power electronic circuit as claimed in claim 1, further comprising a circuit contacting all of the power electronic elements, the circuit disposed on the assembly side of the base circuit carrier.

3. The power electronic circuit as claimed in claim 1, wherein the plurality of power modules are arranged in a row.

4. The power electronic circuit as claimed in claim 1, wherein the plurality of power modules are arranged in a two-dimensional array in a plurality of adjacent rows.

5. The power electronic circuit as claimed in claim 1, further comprising a carrier component mechanically connected to at least some of the plurality of power modules.

6. The power electronic circuit as claimed in claim 5, wherein the carrier component is fixed onto sides of the power modules facing away from the base circuit carrier.

7. The power electronic circuit as claimed in claim 6, wherein the carrier component comprises an intermediate circuit carrier and,
    a portion of the plurality of capacitors are wired in parallel and mounted on a first side of the intermediate circuit carrier facing away from the respective power electronic elements, and electrically connected to the power electronic element.

8. The power electronic circuit as claimed in claim 7, wherein a further carrier component for an additional function is fixed onto the capacitors of the intermediate circuit carrier.

9. The power electronic circuit as claimed in claim 8, wherein the carrier component extends along adjacent power modules and is fixed onto respective side faces formed thereby.

10. The power electronic circuit as claimed in claim 8, wherein the carrier component comprises a cooling device.

11. The power electronic circuit as claimed in claim 8, wherein the carrier component comprises an additional circuit carrier with a circuit.

12. The power electronic circuit as claimed in claim 11, wherein a driver circuit for the power electronic circuit and/or at least some of the power modules are arranged on the additional circuit carrier as a circuit.

13. The power electronic circuit as claimed in claim 8, wherein the carrier component includes a sensor element.

14. The power electronic circuit as claimed in claim 8, wherein the carrier component includes a mechanical stiffening structure.

15. The power electronic circuit as claimed in claim 1, wherein:
    each power module includes two switching elements;
    the power electronic elements of each power module form a half bridge; and
    the power electronic elements are interconnected in three groups, such that each group is assigned to a phase of a three-phase alternating current, wherein each group can receive a direct current.

* * * * *